United States Patent
Daly et al.

(10) Patent No.: US 8,432,197 B2
(45) Date of Patent: Apr. 30, 2013

(54) NONLINEAR AND CONCURRENT DIGITAL CONTROL FOR A HIGHLY DIGITAL PHASE-LOCKED LOOP

(75) Inventors: Denis Clarke Daly, Cambridge, MA (US); Matthew Allen Zornig Straayer, Acton, MA (US)

(73) Assignee: Maxim Integrated Products, Inc., San Jose, CA (US)

( * ) Notice: Subject to any disclaimer, the term of this patent is extended or adjusted under 35 U.S.C. 154(b) by 119 days.

(21) Appl. No.: 13/219,065

(22) Filed: Aug. 26, 2011

(65) Prior Publication Data

US 2012/0218013 A1  Aug. 30, 2012

Related U.S. Application Data

(60) Provisional application No. 61/378,089, filed on Aug. 30, 2010.

(51) Int. Cl.
*H03L 7/06* (2006.01)
(52) U.S. Cl.
USPC .......................................... 327/156; 327/147
(58) Field of Classification Search .................. 327/147, 327/156
See application file for complete search history.

(56) References Cited

U.S. PATENT DOCUMENTS

| 7,532,250 | B2 * | 5/2009 | Sonobe | 348/537 |
| 7,675,448 | B1 * | 3/2010 | Huang et al. | 341/143 |
| 2012/0007668 | A1 * | 1/2012 | Tokumaru et al. | 327/552 |
| 2012/0218013 | A1 * | 8/2012 | Daly et al. | 327/156 |

OTHER PUBLICATIONS

Kratyuk et al., "A Design Procedure for All-Digital Phase-Locked Loops Based on a Charge Phase-Locked-Loop Analogy" IEEE Transactions on Circuits and Systems, vol. 54, No. 3, Mar. 2007, pp. 247-251.
Staszewski et al., "All-Digital PLL and Transmitter for Mobile Phones" IEEE Journal of Solid-State Circuits, vol. 40, No. 12, Dec. 2005, pp. 2469-2482.
Staszewski et al., "All-Digital PLL with Ultra Fast Settling" IEEE Transactions on Circuits and Systems, Express Briefs, vol. 54, No. 2, Feb. 2007, pp. 181-185.
Chen et al., "A Calibration-Free 800 MHz Fractional-N Digital PLL with Embedded TDC" 2010 IEEE International Solid State Circuits Conference, pp. 472-474.
Cho et al., "A 6.5GHz CMOS FSK Modulator for Wireless Sensor Applications" 2002 Symposium on VLSI Circuits of Technical Papers, pp. 182-185.
Perrott, "Techniques for High Data Rate Modulation and Low Power Operation of Fractional-N Frequency Synthesizers" MIT, Sep. 1997, 199 pages.

* cited by examiner

*Primary Examiner* — Adam Houston
(74) *Attorney, Agent, or Firm* — North Weber & Baugh LLP

(57) ABSTRACT

A phase-locked loop circuitry includes an oscillator circuitry having an input and an output. A phase detector circuit is connected to the output of the oscillator circuitry and has outputs thereof. A digital loop filter circuit is connected to the outputs of the phase detector circuitry and has outputs thereof. The outputs of the digital loop filter circuit are coupled, through a summing circuit, to the input of the oscillator circuitry. Values associated with the outputs of the digital loop filter circuit are updated concurrently based upon values associated with the outputs of the phase detector circuitry. One output of the digital loop filter circuitry has a high-pass transfer function.

13 Claims, 6 Drawing Sheets

NONLINEAR AND CONCURRENT DIGITAL CONTROL FOR A HIGHLY DIGITAL PHASE-LOCKED LOOP

PRIORITY INFORMATION

The present application claims priority, under 35 U.S.C. §119(e), from U.S. Provisional Patent Application, Ser. No. 61/378,089, filed on Aug. 30, 2010. The entire content of U.S. Provisional Patent Application Ser. No. 61/378,089, filed on Aug. 30, 2010, is hereby incorporated by reference.

BACKGROUND

The phase-locked loop is a versatile semiconductor circuit used to generate an output signal, such as a clock signal, whose phase is related to the phase of an input signal, such as a reference clock. A phase-locked loop typically consists of several blocks including a phase/frequency detector 10, loop filter 20, an oscillator 30, and frequency divider 40.

The frequency of the oscillator is tunable, and typically controlled by an input voltage or current. The most common type of a frequency tunable oscillator used in phase-locked loops is the type whose frequency is controlled by an input voltage, and is referred to as a voltage controlled oscillator.

The phase/frequency detector 10 compares the phase of the reference clock and the local clock, which is typically the output of the frequency divider 40, as indicated in FIG. 1.

Conventionally, the phase/frequency detector 10, charge-pump and loop filter 20 have been primarily implemented with 'analog' circuit structures. These phase-locked loops are referred to as 'analog phase-locked loops'.

Recently, aided by ongoing semiconductor technology and process scaling, an alternate phase-locked loop architecture has emerged that leverages extensive digital signal processing. These 'digital phase-locked loop' architectures are functionally equivalent, but have different implementations for some of the sub-blocks.

FIG. 3 shows a basic prior art digital phase-locked loop architecture where the analog phase/frequency detector is replaced with a digital phase/frequency detector 120, and the charge-pump and analog loop filter are replaced with a digital loop filter 130 and a digital-to-analog converter 160.

The digital components are designed to mirror the functions of their analog counterparts, and the phase-locked loop locking dynamics are similar.

In the prior art, the core digital loop filter is implemented with a proportional and integral path that mimics an analog loop filter which can be represented in the Z domain with the following transfer function:

$$Y(z) = \left[\alpha + \beta \frac{1}{1-z^{-1}}\right] X(z)$$

where $\alpha$ represents the proportional term, $\beta$ represents the integral term, $X(z)$ represents the output of the phase/frequency detector and $Y(z)$ represents the output of the loop filter.

Such a digital loop filter can be modeled in discrete time as:

$$y[n]=y[n-1]+\alpha x[n]-\alpha x[n-1]+\beta x[n]$$

In prior art, there are separate, non-linear control loops which are used for coarse frequency locking, determining phase-locked loop design parameters, or adjusting the values of $\alpha$ or $\beta$ in real-time; however, the core loop filter does not include algorithms to non-linearly alter the loop filter output in response to phase/frequency detector transitions.

FIG. 4 shows a prior art digital phase-locked loop architecture with a coarse/fine segmented digital-to-analog converter. A challenge in digital phase-locked loops is achieving the high digital-to-analog converter resolution that is required to achieve very precise frequency steps.

Conventional devices have achieved a high digital-to-analog converter resolution by dividing a high resolution digital-to-analog converter into multiple digital-to-analog converter segments of reduced resolution.

When there are two digital-to-analog converter segments, these digital-to-analog converter segments can be referred to as a coarse digital-to-analog converter 161 (digital-to-analog converter A) and a fine digital-to-analog converter 162 (digital-to-analog converter B).

Conventionally, during normal phase-locked loop operation the coarse digital-to-analog converter first converges and then the fine digital-to-analog converter is updated. This method of operation is referred to as sequential operation within this document.

Once the coarse digital-to-analog converter has converged, it no longer updates unless the fine digital-to-analog converter saturates or nears saturation, at which time the coarse digital-to-analog converter is updated to prevent the fine digital-to-analog converter from saturating. When the coarse digital-to-analog converter is updated, any mismatch between the coarse digital-to-analog converter and the fine digital-to-analog converter can result in a frequency error and degrade phase-locked loop performance.

An additional challenge facing both digital and analog phase-locked loops is a fundamental trade-off between phase-locked loop settling time and loop filter bandwidth.

It is often desirable to have low loop filter bandwidths to reduce phase noise while the phase-locked loop is locked, but this comes at the cost of degraded settling time.

A conventional technique to improve this trade-off is to dynamically vary the loop bandwidth while settling. During coarse frequency lock, conventional digital phase-locked loops use non-linear algorithms to decrease the phase-locked loop settling time compared to a linear algorithm; however, once the coarse sequence of lock is complete, conventional digital phase-locked loops employ linear control loops which can result in degraded settling time, especially at low digital phase/frequency detector resolutions.

DESCRIPTION OF THE DRAWINGS

Figure 1:
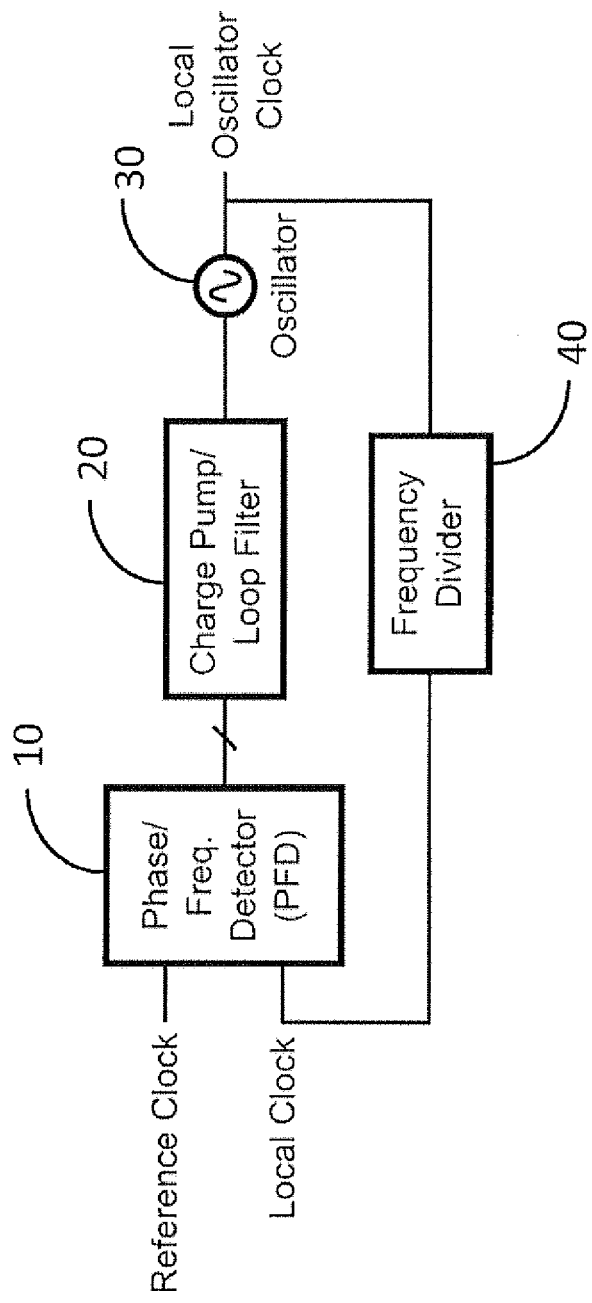
FIG. 1 is a block diagram of a conventional phase-locked loop.
Figure 2:
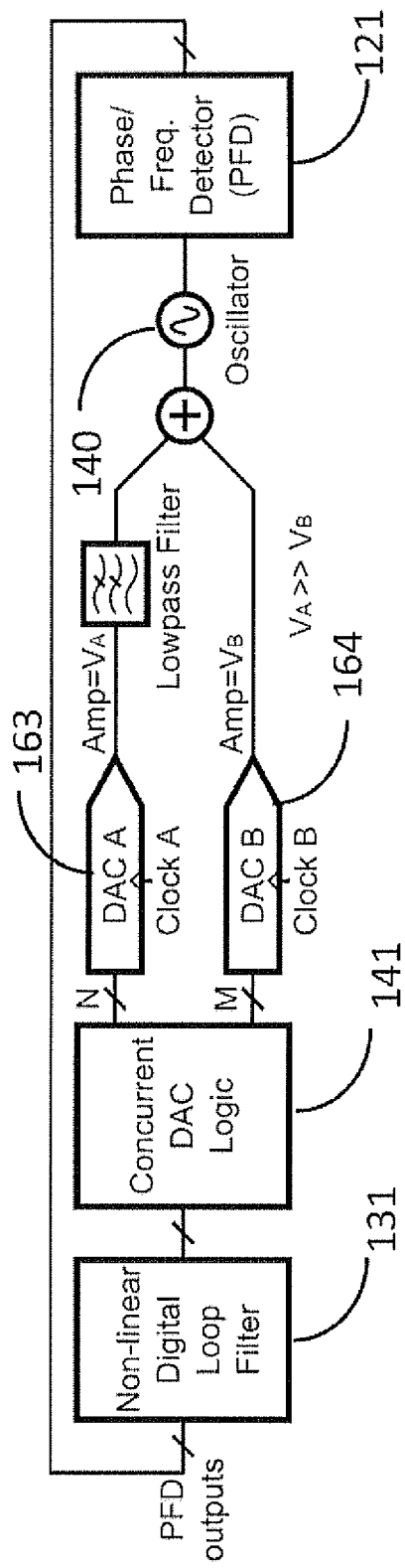
FIG. 2 is a block diagram of a digital phase-locked loop.
Figure 3:
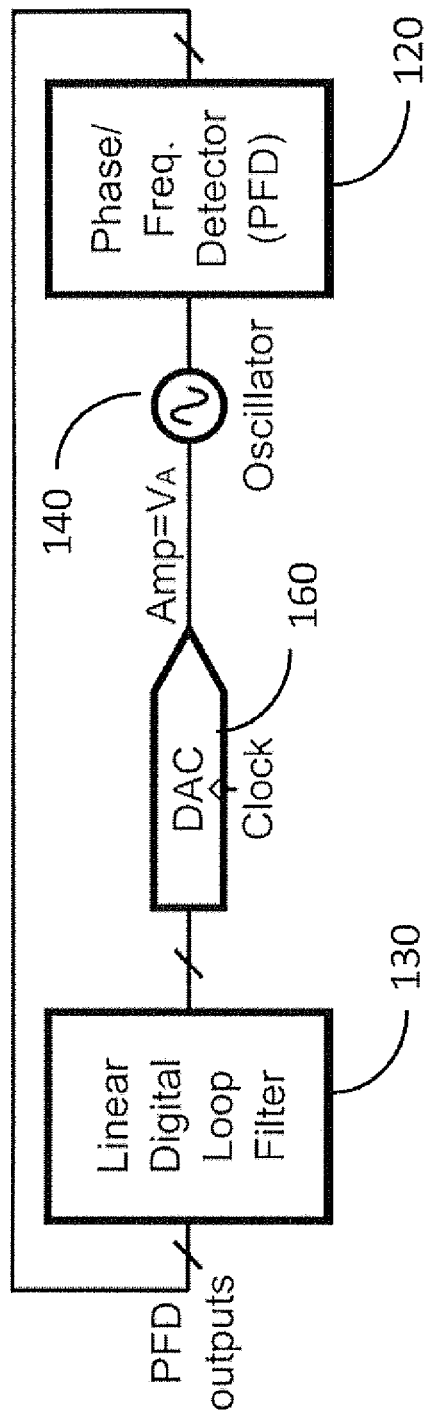
FIG. 3 is a block diagram of a conventional digital phase-locked loop.
Figure 4:
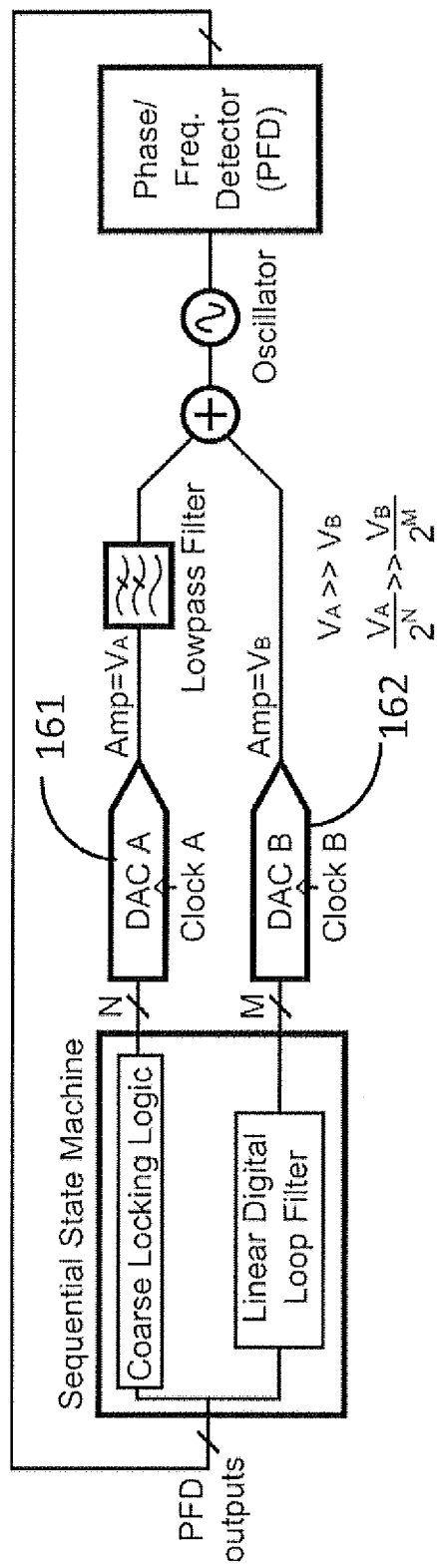
FIG. 4 is a block diagram of a conventional digital phase-locked loop with coarse and fine control.

FIG. 2 illustrates a block diagram of a digital phase-locked loop. Although the frequency divider is not shown for brevity, one skilled in the art would readily know how to include a frequency divider in any of the embodiments described below.

The illustrated digital phase-locked loop includes a frequency tunable oscillator 140, a digital phase/frequency detector 121, a non-linear digital loop filter 131, logic 141 to generate signals for multiple digital-to-analog converters (not shown) concurrently, and digital-to-analog converters 163 and 164. The output of the digital-to-analog converter 163 is lowpass filtered. The output of the digital-to-analog converter 164 and the lowpass filtered output of the digital-to-analog converter 163 are combined at the frequency tunable oscillator 140.

It is noted that the disclosed digital phase-locked loop can also be extended to systems with more than two digital-to-analog converters.

Figure 5:
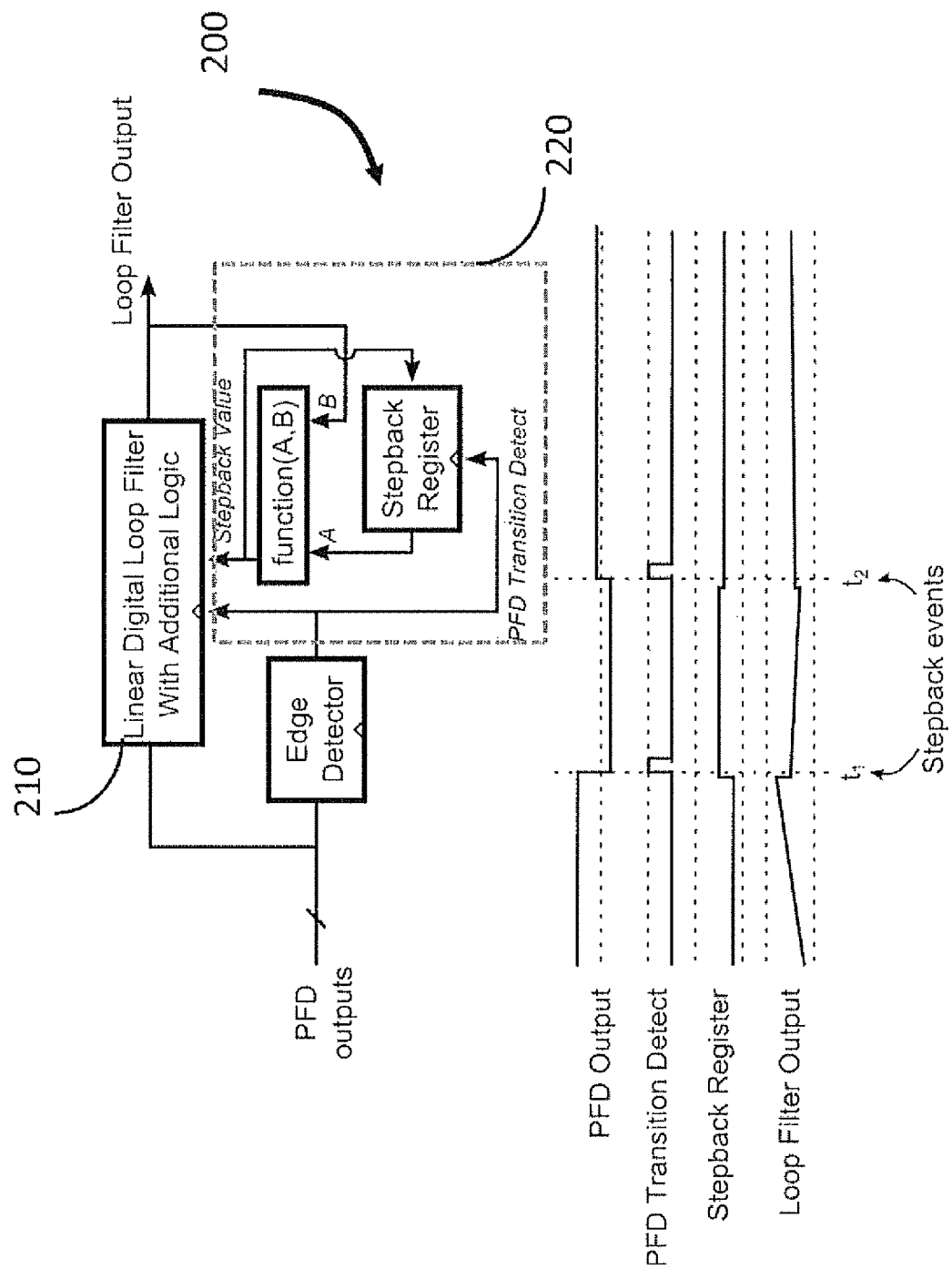
FIG. 5 is a block and timing diagram of a non-linear loop filter.

FIG. 5 illustrates a block and timing diagram of a non-linear loop filter 200 that is used to improve the settling time and tracking bandwidth of a digital phase-locked loop. The non-linear loop filter is based on a core linear loop filter with non-linear logic 220 that adjusts the output of the loop filter in response to phase/frequency detector transitions.

The core linear loop filter 210 responds to the phase/frequency detector 121 each reference clock period and increments or decrements the output of the digital loop filter accordingly.

Many digital phase-locked loops use low resolution phase/frequency detectors with only a few bits of resolution representing the phase difference between the reference and the local clock. At such low phase/frequency detector resolutions, the core linear control loop results in sub-optimal control because the phase/frequency detector output does not change immediately in response to phase or frequency changes of the local clock relative to the reference clock. This most commonly results in frequency overshoot of the local clock and the potential for large oscillations around the desired frequency during frequency and phase acquisition.

The non-linear loop filter 200 of FIG. 5 provides a non-linear transition in response to a change in the phase/frequency detector output. The phase/frequency detector edge detector indicates when there is a change in the phase/frequency detector output. At this time, the non-linear loop filter provides an output that is a ratio of its most recent value and the loop filter's value immediately after the prior transition in the phase/frequency detector output. This is shown graphically in FIG. 5, where phase/frequency detector transitions occur at times $t_1$ and $t_2$. For simplicity, time $t_1$ has been normalized to 0.

The implementation of FIG. 5 will now be explained mathematically. At time $t_1=0$, it is assumed that the frequency of the local clock, $f_{clk}$, is $\Delta f$ greater than the reference clock, $f_{ref}$, and it is assumed that their phases, $\Phi_{clk}$ and $\Phi_{ref}$ are aligned:

$$f_{clk}(t_1) - f_{ref} = \Delta f$$

$$\Phi_{clk}(t_1) - \Phi_{ref}(t_1) = 0$$

As the local clock is faster than the reference clock at time $t_1$, the reference clock will lag the local clock and the digital loop filter will decrease the frequency of the local clock. As described earlier, the core, linear digital loop filter can be modeled by the following discrete-time function:

$$y[n] = y[n-1] + \alpha x[n] - \alpha x[n-1] + \beta x[n]$$

In another embodiment, the core digital loop filter is modified with a non-linear component 220 that changes the output y[n] in response to changes in x[n]. This can be represented with the following discrete-time function:

$$y[n] = y[n-1] + \alpha x[n] - \alpha x[n-1] + \beta x[n] + \text{Nonlinear component}$$

To mathematically show the benefit of the non-linear component 220, it is assumed to be 0. As the reference frequency is typically an order of magnitude greater than the phase-locked loop bandwidth, for mathematical simplicity, one can use the following continuous time equation to model the core, linear digital loop filter:

$$y(t) = y(t_1) - Ax(t_1) + Ax(t) + \int_{t_1}^{t} Bx(t)dt$$

where y(t) is the output of the core linear loop filter at time t, x(t) is the output of the phase/frequency detector, A is the proportional scaling term and B is the integral scaling term.

For small changes in the output of the loop filter, y(t), a linear change in the loop filter output should result in a linear change in voltage controlled oscillator frequency, with a scaling factor assumed to be $\mu$. Thus, the local clock frequency can be represented by the following equation:

$$f_{clk}(t) = f_{clk}(t_1) - \mu A x(t_1) + \mu A x(t) + \int_0^t \mu B x(t) dt$$

Between time $t_1$ and $t_2$, we can model the phase difference between the reference clock and the input clock with the following equation:

$$\Phi_{clk}(t) - \Phi_{ref}(t) = \int_0^t (f_{clk}(t) - f_{ref}) dt$$

$$= \int_0^t f_{clk}(t) dt - t f_{ref}$$

$$\Phi_{clk}(t) - \Phi_{ref}(t) = \int_0^t (f_{clk}(t) - f_{ref}) dt$$

$$= \int_0^t \left( f_{clk}(t_1) - \mu A x(t_1) + \mu A x(t) + \int_0^t \mu B x(t) dt - f_{ref} \right) dt$$

$$= \int_0^t \left( \mu A x(t) + \int_0^t \mu B x(t) dt \right) dt + (f_{clk}(t_1) - \mu A x(t_1) - f_{ref}) t$$

For mathematical simplicity, it can be assumed that the phase/frequency detector output, x(t) is constant between time $t_1$ and $t_2$. This is true when a single-bit phase/frequency detector is used, such as a bang-bang phase detector. With the assumption that $x(t) = x_1$ between time $t_1$ and $t_2$, the following equation expression is derived for the phase difference.

$$\Phi_{clk}(t) - \Phi_{ref}(t) = \int_0^t (\mu A x_1 + \mu B x_1 t) dt +$$

$$(f_{clk}(t_1) - \mu A x_1 - f_{ref}) t$$

$$= \mu A x_1 t + 0.5 \mu B x_1 t^2 +$$

$$(f_{clk}(t_1) - \mu A x_1 - f_{ref}) t$$

$$= 0.5 \mu B x_1 t^2 + (f_{clk}(t_1) - f_{ref}) t$$

At time $t_2$, the phase difference is 0, resulting in the following expression for $t_2$:

$$t_2 = -2 \frac{f_{clk}(t_1) - f_{ref}}{\mu B x_1}$$

Combining the previous equation with the equation for calculating the local clock frequency, the frequency at time $t_2$ is derived to be the following expression:

$$f_{clk}(t_2) = f_{clk}(t_1) - \mu B x_1 t_2$$
$$= f_{clk}(t_1) - 2(f_{clk}(t_1) - f_{ref})$$
$$= 2f_{ref} - f_{clk}(t_1)$$

Thus, the difference in frequency between the local clock and the reference clock has equal magnitude at times $t_1$ and $t_2$ but opposite sign.

For optimal phase-locked loop locking, the loop filter should be adjusted immediately after time $t_2$ to the average value of the loop filter at time $t_1$ and $t_2$.

In another embodiment, the frequency of the local clock is set to the average of $f_{clk}(t_1)$ and $f_{clk}(t_2)$ for quickest locking; however, it is also possible to set the frequency of the local clock to some other ratio of $f_{clk}(t_1)$ and $f_{clk}(t_2)$.

In a further embodiment, the phase-locked loop contains a multi-bit phase/frequency detector. In this embodiment, the non-linear algorithm is adjusted to account for the different frequency overshoot compared to a single-bit phase/frequency detector. When using a multi-bit phase/frequency detector, the non-linear algorithm can adjust the loop filter output at arbitrary phase/frequency detector transitions.

For example, it is possible to only implement non-linear steps when the phase/frequency detector changes sign. Alternatively, there can be non-linear steps at every phase/frequency detector transition.

In an additional embodiment, the phase-locked loop contains either a multi-bit or single-bit phase/frequency detector. In this embodiment, the non-linear algorithm accounts for system effects like latency and the non-linear relationship between loop filter output and voltage controlled oscillator frequency.

In another embodiment, the non-linear control algorithm is applied to phase-locked loops where the digital loop filter and digital-to-analog converter are replaced with an analog charge-pump and loop filter. In these analog phase-locked loops, the non-linear control algorithm is applied at the output of the charge-pump in response to transitions in the phase/frequency detector output.

For example, a capacitor can be used to store a previous value of the loop-filter output, and it can shorted to the current loop-filter output to result in an instantaneous step in the loop filter, resulting in a change in frequency to compensate for frequency overshoot.

In the majority of digital phase-locked loops, the output of the digital loop filter is passed to one or more digital-to-analog converters and then filtered before the frequency tunable oscillator.

This can complicate the aforementioned non-linear control loop because the non-linearities result in abrupt transitions at the output of the digital-to-analog converters, which are then filtered by analog filters at the outputs of the digital-to-analog converters. Any filtering of the non-linear transition by an analog filter decreases the effectiveness of the non-linear algorithm because by filtering the abrupt transitions the frequency overshoot is not cancelled as rapidly.

Another embodiment addresses this problem of digital-to-analog converter filtering through a combination of several alternate techniques.

One technique to address this problem is to increase the bandwidth of the analog filters so that the non-linear transitions are presented to the frequency tunable oscillator with little attenuation or delay.

A second technique is to hold the output of the non-linear loop filter constant after a non-linear transition, providing time for the analog filter outputs to converge to the expected value.

Finally, a third technique is to use a secondary digital-to-analog converter in parallel with a primary digital-to-analog converter, but to design the system such that the secondary digital-to-analog converter has a wider analog filter bandwidth. This secondary digital-to-analog converter can be used to introduce abrupt frequency changes in the frequency tunable oscillator.

A desire in digital phase-locked loop design is to efficiently implement digital frequency tuning of the oscillator. For a high performance phase-locked loop, an oscillator tuning dynamic range of over 20 bits may be required.

For example, to achieve low phase noise at a specific output frequency, an oscillator tuning range of over 20% is typically required to compensate for process, temperature, and voltage variation, and a step size of 0.0002% is required for low jitter frequency locking. This corresponds to a step size of 1 kHz and a tuning range of 1 GHz for a 5 GHz oscillator, requiring a tuning dynamic range of 1 million to one or 20 bits.

To meet these specifications, the majority of oscillator tuning approaches use a segmented approach, where multiple digital-to-analog converters are used to cover the entire 20-bit range, and each of the digital-to-analog converters' ranges overlaps one another to ensure continuous coverage of digital-to-analog converter ranges.

Typically there are 'fine', 'moderate' and 'coarse' digital-to-analog converters, with progressively larger least significant bit values. Each of the digital-to-analog converters are programmed sequentially, meaning that once the 'coarse' digital-to-analog converter is set, its output is fixed while a finer digital-to-analog converter is programmed, unless the finer digital-to-analog converter saturates or approaches saturation.

A problem with the this sequential approach is that the phase-locked loop has a limited tracking range once in lock, limited by the dynamic range the digital-to-analog converter with the smallest least significant bit; i.e., the finest digital-to-analog converter.

If the finest digital-to-analog converter saturates, the second finest digital-to-analog converter must raise/lower its output, which can result in the phase-locked loop losing lock due to mismatch between the two digital-to-analog converters.

This problem is particularly acute for systems where the phase-locked loop must remain in lock for many seconds or minutes during which time the circuit may undergo severe temperature or voltage swings. These temperature or voltage swings can affect the frequency of the voltage controlled oscillator, requiring a change in the voltage controlled oscillator control voltage. If the control voltage has to change by a large amount, it is possible that the finest digital-to-analog converter can saturate.

Figure 6:
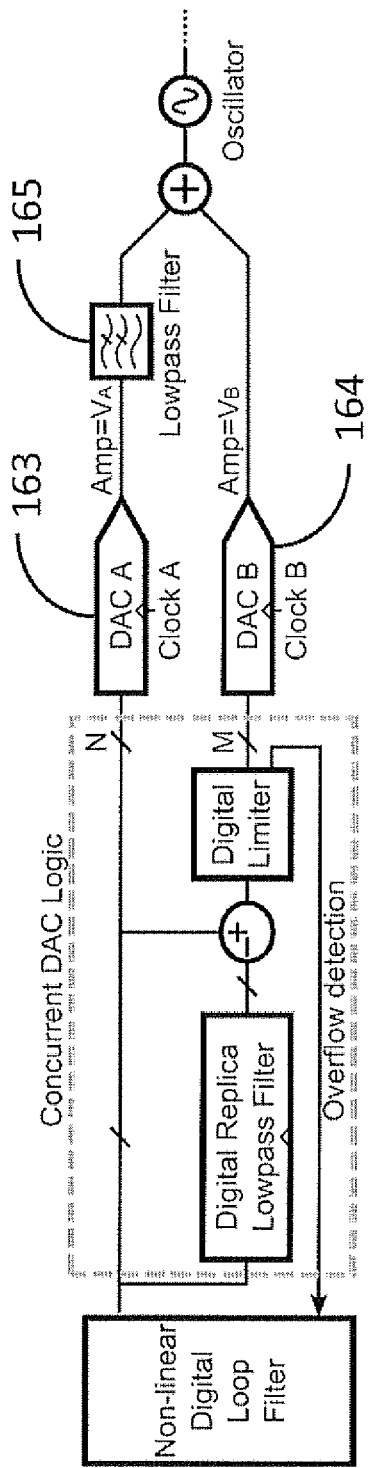
FIG. 6 is a block diagram of digital-to-analog converter logic and a segmented digital-to-analog converter.

FIG. 6 illustrates a solution which utilizes concurrent control logic that allows for multiple digital-to-analog converters to be updated simultaneously.

As illustrated in FIG. 6, the solution includes concurrent control logic for the phase-locked loop digital state machine and the segmented digital-to-analog converter.

The sequential coarse/fine acquisition process of conventional digital phase-locked loops is replaced with the concurrent digital-to-analog converter logic, and segmented digital-to-analog converters are arranged to have approximately the same least significant bit size but different ranges and signal bandwidths.

In FIG. 6, the least significant bit size of digital-to-analog converter 163 is roughly equal to that of the digital-to-analog converter 164, implying $V_A/2^N \approx V_B/2^M$. In addition, the resolution of digital-to-analog converter 163 is greater than that of digital-to-analog converter 164, implying N>M.

Both of these qualities are different than conventional digital phase-locked loops, where the least significant bit of the coarse digital-to-analog converter is significant larger than the least significant bit of the fine digital-to-analog converter It is noted that this concurrent digital-to-analog converter control technique does not require the least significant bit size of the two digital-to-analog converters to be identical, but for optimal performance there should be some overlap in the ranges of the digital-to-analog converters.

Thus, it is possible to apply this control technique to traditional coarse/fine digital-to-analog converters within phase-locked loops by replacing the sequential control logic with the concurrent digital-to-analog converter logic.

In another embodiment, the digital-to-analog converter 163 in FIG. 6 achieves a superior dynamic range to that of conventional digital phase-locked loops. This superior dynamic range is achieved by trading off bandwidth for resolution. It is well known that for digital-to-analog converters, particularly oversampling digital-to-analog converters, it is possible to trade-off bandwidth for resolution.

Thus, by reducing the filter bandwidth at the output of the digital-to-analog converter 163, it is possible to achieve a very high resolution, covering nearly the entire tuning range of the oscillator. This allows the phase-locked loop to achieve a large tracking range while in lock.

Due to the large dynamic range of digital-to-analog converter 163, the phase-locked loop shown in FIG. 6 would be able to successfully lock without digital-to-analog converter 164; however, this phase-locked loop would achieve a degraded phase-locked loop tracking bandwidth and lock time compared to prior art digital phase-locked loops, due to the low frequency lowpass filter 165 at the output of digital-to-analog converter 163.

To address this problem, digital-to-analog converter 164 is placed in parallel with digital-to-analog converter 163 and used to compensate for fast transients and improve locking speed.

In an additional embodiment, additional digital-to-analog converters are placed in parallel with these two digital-to-analog converters to increase the overall tuning range, compensate for fast transients and/or improve locking speed It is also possible to partially combine the sequential control logic with the concurrent digital-to-analog converter logic. For example, a coarse digital-to-analog converter can be programmed first, and then a medium and a fine digital-to-analog converter can be concurrently programmed.

In a further embodiment, the concurrent logic replicates analog filtering at the output of the digital-to-analog converters. In this embodiment, the loop filter output is applied directly to digital-to-analog converter 163, but the high frequency components of the loop filter output are filtered by the analog lowpass filter 165. To compensate for this signal filtering, a digital lowpass filter in the concurrent digital-to-analog converter logic replicates this analog filter, and the difference between the loop filter output and the digital lowpass filter is applied to digital-to-analog converter 164.

This technique is similar to pre-emphasis, but applied in a new way by using a separate path. In this embodiment, digital-to-analog converter 164 is only used to address high frequency signals from the loop filter. When using a non-linear loop filter with large transitions during frequency acquisition, the fast digital-to-analog converter 164 path is particularly useful. During lock, when the loop filter does not have large transitions, the fast digital-to-analog converter 164 allows for increased tracking bandwidth.

When digital-to-analog converter 164 has a reduced dynamic range compared to digital-to-analog converter 163, the difference between the loop filter output and the digital lowpass filter must be truncated before being applied to digital-to-analog converter 164.

Thus, digital-to-analog converter 164 can potentially saturate in the presence of very large and fast transients at the loop filter output. These fast transients occur often during initial phase/frequency acquisition, particularly when the non-linear locking algorithm is applied.

In another embodiment, when the fast digital-to-analog converter 164 saturates, a digital overflow signal is generated that is passed to the loop filter and other digital state machines within the phase-locked loop. The overflow signal is used to reduce the gain of the non-linear loop filter when saturation occurs.

To reduce the occurrence of digital-to-analog converter saturation during initial phase/frequency locking, this embodiment increases the bandwidth of the analog filter 165 at the output of the slow digital-to-analog converter 163 as well as the bandwidth of the digital replica filter within the concurrent state machine. Once the phase lock has converged to a steady state, the bandwidths of these filters are reduced to improve the noise performance of the phase-locked loop.

In summary, a digital phase-locked loop is implemented using a non-linear algorithm to allow for rapid frequency and phase lock. The advantages of the non-linear algorithm are most pronounced when the digital phase/frequency detector has low time resolution, such as a bang-bang phase detector, which provides only a single bit indicating whether the phase of the local clock is early or late compared to that of that of the input signal, for example, the reference clock The non-linear loop filter algorithm is based on a linear loop filter but includes additional logic to compensate for the phase-locked loop frequency overshoot that occurs with linear loop filters and low resolution phase/frequency detectors. The non-linear loop filter algorithm involves a stepback function, which alters the output of the core linear loop filter whenever the digital phase/frequency detector output changes value. The change in output of the loop filter is related to the amount of time since prior phase/frequency detector transitions, and/or the loop filter output value at these prior transitions. Conventional non-linear loop filter algorithms have not extended linear loop filters to account for the frequency overshoot associated with low resolution phase/frequency detectors.

In addition, the disclosed digital phase-locked loop allows for an increased tracking range of the phase-locked loop by concurrently generating digital-to-analog converter inputs for multiple digital-to-analog converters simultaneously.

In this embodiment, a high dynamic range, but lowpass filtered digital-to-analog converter is updated at the same time as a lower dynamic range digital-to-analog converter.

As a digital-to-analog converter is lowpass filtered, it can employ oversampling to achieve increased dynamic range without a significant increase in complexity, power consumption, or area.

The digital-to-analog converter's large dynamic range allows the phase-locked loop to remain in lock over a wide range of operating conditions with less potential loss of lock compared to a conventional coarse/fine segmented digital-to-analog converter with sequential control. Whereas one digital-to-analog converter has a lowpass, slowly varying characteristic, one digital-to-analog converter has a highpass, fast varying characteristic, allowing the overall phase-locked loop to have a wide bandwidth and fast settling time without increased phase noise.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A phase-locked loop circuitry to generate an output signal, the phase-locked loop circuitry comprising:
   oscillator circuitry having an input and an output;
   phase detector circuitry, operatively connected to said output of said oscillator circuitry, having outputs thereof; and
   a digital loop filter circuitry, operatively connected to said outputs of said phase detector circuitry, having outputs thereof, said outputs of said digital loop filter circuitry being operatively coupled, through a summing circuit, to said input of said oscillator circuitry, values associated with said outputs of said digital loop filter circuitry being updated concurrently based upon values associated with said outputs of said phase detector circuitry, one output of said digital loop filter circuitry having a high-pass transfer function.

2. The phase-locked loop circuitry of claim 1, wherein said digital loop filter circuitry includes a digital-to-analog-converter for each output.

3. The phase-locked loop circuitry of claim 1, wherein one output of said digital loop filter circuitry is filtered prior to being coupled to the oscillator circuitry input.

4. The phase-locked loop circuitry of claim 1, wherein multiple outputs of said digital loop filter circuitry are filtered prior to being coupled to the oscillator circuitry input, each output being filtered using a different bandwidth.

5. The phase-locked loop circuitry of claim 1, wherein multiple outputs of said digital loop filter circuitry are filtered prior to being coupled to the oscillator circuitry input, each output being filtered using a programmable bandwidth that is adjusted in real-time during normal operation.

6. The phase-locked loop circuitry of claim 1, wherein the oscillator frequency tuning range of each digital loop filter output is overlapping.

7. The phase-locked loop circuitry of claim 1, wherein one output of said digital loop filter circuitry has a non-linear transfer function.

8. A phase-locked loop circuitry to generate an output signal, the phase-locked loop circuitry comprising:
   oscillator circuitry having an input and an output;
   phase detector circuitry, operatively connected to said output of said oscillator circuitry, having outputs thereof; and
   a non-linear digital loop filter circuitry, operatively connected to said outputs of said phase detector circuitry, having outputs thereof, said outputs of said non-linear digital loop filter circuitry being operatively coupled to said input of said oscillator circuitry, wherein a value associated with an output of said non-linear digital loop filter circuitry has a non-linear transition when there is a change in an output of said phase detector circuitry.

9. The phase-locked loop circuitry of claim 8, wherein said change in the output of said phase detector is a sign change.

10. The phase-locked loop circuitry of claim 8, wherein a resultant value associated with an output of said non-linear digital loop filter is a weighted average of a most recent value of the output of said nonlinear digital loop filter and a value of the output of said nonlinear digital loop filter after a most recent non-linear transition.

11. The phase-locked loop circuitry of claim 8, wherein after a non-linear transition in an output of said non-linear digital loop filter circuitry, values associated with said outputs of said non-linear digital loop filter circuitry do not update for a period of time.

12. The phase-locked loop circuitry of claim 11, wherein the period of time that the values associated with said outputs of said non-linear digital loop filter circuitry do not update after a non-linear transition is related to a magnitude of the non-linear transition.

13. The phase-locked loop circuitry of claim 8, wherein said non-linear digital loop filter circuitry includes digital-to-analog-converters coupled to analog filters, a bandwidth of said analog filter being adjusted in response to a magnitude of a non-linear transition in an output of said non-linear digital loop filter circuitry.

* * * * *